United States Patent
Flinn

(10) Patent No.: US 6,358,481 B1
(45) Date of Patent: Mar. 19, 2002

(54) ELECTRICALLY SAFE DUAL ELECTRODE PLASMA TREATMENT CHAMBER SYSTEM

(75) Inventor: John J. Flinn, Endicott, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 09/712,106

(22) Filed: Nov. 14, 2000

(51) Int. Cl.[7] ................................................. B01J 19/08
(52) U.S. Cl. ................................................. 422/186.05
(58) Field of Search ..................... 422/186.05

(56) References Cited

U.S. PATENT DOCUMENTS

| | | |
|---|---|---|
| 3,780,255 A | 12/1973 | Boom |
| 3,872,278 A | 3/1975 | Boom |
| 4,466,258 A | 8/1984 | Sando et al. |
| 4,550,578 A | 11/1985 | Sando et al. |
| 4,714,891 A | 12/1987 | Morrison, Jr. |
| 4,956,582 A | 9/1990 | Bourassa |
| 5,254,372 A | 10/1993 | Nichols |
| 5,394,061 A | 2/1995 | Fujii |
| 5,945,353 A | 8/1999 | Hashizume et al. |
| 5,972,160 A | 10/1999 | Straemke |

Primary Examiner—Kishor Mayekar
(74) Attorney, Agent, or Firm—Schwartz & Weinrieb

(57) ABSTRACT

A dual electrode plasma treatment chamber system comprises first and second plasma treatment chambers coaxially disposed with respect to each other within an insulated enclosure. A wire to be treated is adapted to be coaxially disposed through both of the plasma treatment chambers. A high voltage generator transformer has its primary winding stage electrically connected to ground, whereas opposite ends of its secondary winding stage are respectively electrically connected to first and second electrodes respectively mounted upon the first and second plasma treatment chambers. In this manner, equal and opposite voltage levels, which are equal in magnitude but 180° out-of-phase with respect to each other, are applied to each electrode. Accordingly, low-level voltage and current values are present upon a portion of the wire to be treated which is disposed externally of the insulated enclosure.

18 Claims, 1 Drawing Sheet

ELECTRICALLY SAFE DUAL ELECTRODE PLASMA TREATMENT CHAMBER SYSTEM

FIELD OF THE INVENTION

The present invention relates generally to plasma treatment chamber system for treating cables, wires, filaments, strands, or the like, and more particularly to a dual electrode plasma treatment chamber system which effectively renders the system electrically safe for operator personnel.

BACKGROUND OF THE INVENTION

Plasma reactors or plasma generators are of course well-known in the art. It is also well-known in the art to utilize such plasma reactors or plasma generators to treat cables, wires, filaments, strands, or the like for various purposes or objectives in connection with further usage or processing of such cables, wires, filaments, strands, or the like. Plasma reactors or plasma generators which are utilized for such purposes or objectives are exemplified within U.S. Pat. No. 5,972,160 which issued to Straemke on Oct. 26, 1999, U.S. Pat. No. 5,254,372 which issued to Nichols on Oct. 19, 1993, U.S. Pat. Nos. 4,550,578 and 4,466,258 which issued to Sando et al. on Nov. 5, 1985 and Aug. 21, 1984, respectively, and U.S. Pat. Nos. 3,872,278 and 3,780,255 which issued to Boom on Mar. 18, 1975 and Dec. 18, 1973, respectively.

In addition to the aforenoted patents and the various cable, wire, filament, or strand processing systems disclosed therein, a commercially available cable or wire plasma treatment chamber system is disclosed within FIG. 1. In accordance with such a PRIOR ART system, it is seen that the PRIOR ART system is of the single electrode type. More particularly, the PRIOR ART cable or wire plasma treatment chamber system is generally indicated by the reference character 10 and is seen to comprise an insulated enclosure 12 within which a cylindrically configured tubular plasma treatment chamber 14 is disposed. A wire to be treated is disclosed at 16 and it is seen that the wire 16 is in effect adapted to be disposed coaxially within the plasma treatment chamber 14. A high voltage generator comprises, for example, a transformer 18 which includes a primary winding stage 20 and a secondary winding stage 22. A first end of the secondary winding stage 22 of the high voltage generator transformer 18 is electrically connected to an electrode 24 of the plasma treatment chamber 14 by means of a first electrical conductor wire 26, and the second end of the secondary winding stage 22 of the high voltage generator transformer 18 is electrically connected to ground as at 28 by means of a second electrical conductor wire 30. The primary winding stage 20 of the high voltage generator transformer 18 is also electrically connected to ground as at 32 by means of a third electrical conductor wire 34, and the wire 16 to be treated is also grounded as at 36. It is therefore apparent that in accordance with such a single electrode plasma treatment chamber system 10, the return current for the plasma, shown by the arrows C, has to flow by means of the wire 16 outside of the plasma chamber 14 which is in effect electrically connected to the secondary winding stage 22 of the high voltage generator transformer 18 through means of a ground path. This is a very dangerous situation or condition in view of the fact that this arrangement or structural assembly presents potentially lethal voltage levels to the wire 16 to be treated. More particularly, if the operator is grounded and touches the treated wire 16 while the plasma chamber 14 is in operation, the operator completes the high voltage series circuit from the treated wire 16 to ground. In view of the additional fact that the primary winding stage 20 of the high voltage generator transformer 18 is electrically connected to a conventional power source, while the secondary winding stage 22 is characterized by means of a voltage level of, for example, 30,000V, the voltage that would be present upon the wire 16, which is derived from the plasma within the chamber 14, would be 1.6 kV peak-to-peak with an RMS value of approximately 538V. The source impedance is also noted as being low enough to produce 181 mA RMS of current. These levels are well above acceptable amplitudes, such as, for example, 30 mA that can Cause respiratory paralysis, or 75 mA that can cause heart fibrillation.

The prior art has sought to rectify the aforenoted operational difficulties, drawbacks, or disadvantages by in effect, for example, incorporating, adding, or impressing capacitive and inductive loading within, to, or upon the wire to be treated. Such solutions, however, have not in fact proven to be adequate or viable in view of the fact that such implementations have still permitted enough voltage to remain upon the treated wire to result in shocking the operator. In addition, different types and sizes of wires require different capacitive and inductive levels, values, or loads to be utilized in connection with the particularly sized or types of wires in order to achieve the desired loading and reduction in the voltage and current levels or values. These solutions therefore entail considerable added expenses, they require additional setup time and procedures, and they result in substantial operational downtime.

A need therefore exists in the art for a new and improved plasma treatment chamber system for treating wires wherein the system is rendered electrically safe for operator personnel while overcoming the various operational drawbacks or disadvantages characteristic of the prior art systems in that additional capacitive or inductive loading devices are not in fact required, and wherein further, time-consuming setup arrangements, tailored for each different type or size of wire being treated, are also rendered unnecessary.

OBJECTS OF THE INVENTION

Accordingly, it is an object of the present invention to provide a new and improved plasma treatment chamber system for treating wires.

Another object of the present invention is to provide a new and improved plasma treatment chamber system for treating wires which overcomes the various operational and procedural disadvantages or drawbacks characteristic of the prior art.

An additional object of the present invention is to provide a new and improved plasma treatment chamber system for treating wires wherein the system is rendered electrically safe for operator personnel.

A further object of the present invention is to provide a new and improved plasma treatment chamber system for treating wires wherein the system is operable with all types and sizes of wires without requiring the additional implementation or incorporation of auxiliary capacitive or inductive loading devices.

SUMMARY OF THE INVENTION

The foregoing and other objectives are achieved in accordance with the teachings and principles of the present invention through the provision of a new and improved plasma treatment chamber system for treating wires wherein, in lieu of the single electrode system characteristic of the prior art, the system of the present invention comprises a dual electrode plasma treatment chamber system. More particularly, a second plasma chamber is disposed within the insulated enclosure, and the first end of the secondary winding stage of the high voltage generator transformer is electrically connected to the electrode of the first plasma treatment chamber. However, in accordance with the unique and novel arrangement and electrical connections defined between first and second plasma treatment chambers and the secondary winding stage of the high voltage generator transformer, and more particularly, in lieu of the second end of the secondary winding stage of the high voltage generator transformer being electrically connected to ground, the second end of the secondary winding stage of the high voltage generator transformer is electrically connected to the electrode of the second plasma treatment chamber.

Equal and opposite voltages, that is, voltage levels which are equal in amplitude but opposite in phase, or in other words, 180° out-of-phase with respect to each other, are therefore applied to each electrode. As a result of such an arrangement or disposition of the dual plasma treatment chambers and the electrical connection of their respective electrodes to the secondary winding stage of the high voltage generator transformer, the loading effects of the two out-of-phase electrodes effectively cancel each other whereby substantially all of the circulating electrical current is contained within the insulated enclosure while only voltage levels, which are acceptably low from a personnel safety point of view, are effectively impressed or present upon, for example, that portion of the wire to be treated which is disposed externally of the insulated enclosure, and yet, the voltage levels are obviously nevertheless sufficient enough within each plasma treatment chamber to permit the desired surface treatment of the wire to still be achieved.

BRIEF DESCRIPTION OF THE DRAWINGS

Various other objects, features, and attendant advantages of the present invention will be more fully appreciated from the following detailed description when considered in connection with the accompanying drawings in which like reference characters designate like or corresponding parts throughout the several views, and wherein.

DETAILED DESCRIPTION OF THE PREFERRED EMBODIMENT

Figure 2:
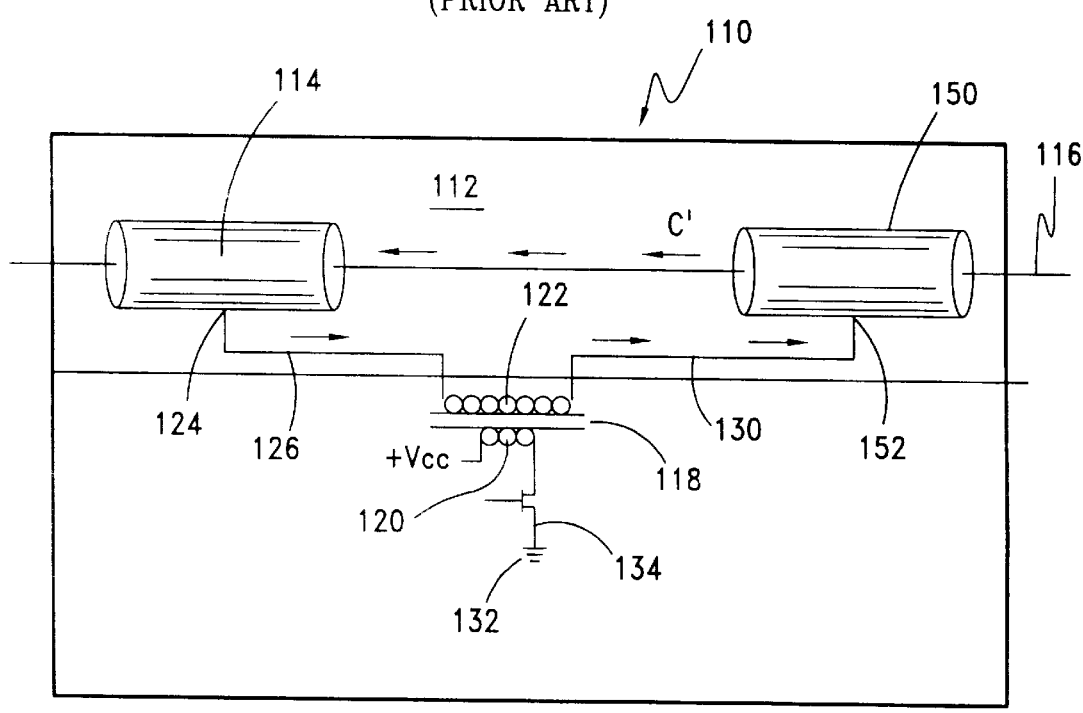
FIG. 2 is a schematic diagram of a new and improved dual electrode plasma treatment chamber system constructed in accordance with the principles and teachings of the present invention and showing the cooperative parts thereof.

Referring now to the drawings, and more particularly to FIG. 2 thereof, a new and improved dual electrode plasma treatment chamber system, constructed in accordance with the principles and teachings of the present invention and showing the cooperative parts thereof, is disclosed and is generally indicated by the reference character 110. It is to be initially noted that with respect to the new and improved dual electrode plasma treatment chamber system 110 of the present invention, as compared to the PRIOR ART single electrode plasma treatment chamber system 10, that components of the new and improved dual electrode plasma treatment chamber system 110 of the present invention which correspond to similar components of the PRIOR ART single electrode plasma treatment chamber system 10 will be designated by corresponding reference characters except that the reference characters will be within the 100 series.

Continuing then with respect to the description of the new and improved dual electrode plasma treatment chamber system 110 of the present invention as disclosed within FIG. 2, it is seen that the new and improved dual electrode plasma treatment chamber system 110 comprises an insulated enclosure 112 within which a first plasma treatment chamber 114 is disposed, and in accordance with the principles and teachings of the present invention, a second plasma treatment chamber 150 is likewise disposed within the insulated enclosure 112. The first and second plasma treatment chambers 114,150 are coaxially disposed with respect to each other, and a wire to be treated, disclosed at 116, is adapted to be coaxially disposed within both of the first and second plasma treatment chambers 114,150. It is to be noted that while the first and second plasma treatment chambers 114, 150 are illustrated as being coaxially spaced apart within the insulated enclosure 112, the first and second plasma treatment chambers 114,150 can alternatively be disposed within a separate insulated housing and can also be disposed coaxially adjacent to each other as long as the axial spacing is sufficient enough to prevent any arcing from occurring between the first and second plasma treatment chambers 114,150. Still further or alternatively, a suitable insulator or insulation member can in fact be interposed between the first and second plasma treatment chambers 114,150 when the plasma treatment chambers 114,150 are in fact disposed coaxially adjacent to each other so as to in fact, again, prevent any arcing from occurring therebetween. The important factor in connection with the provision of the first and second plasma treatment chambers 114,150 is that the plasma treatment chambers 114,150 are essentially the same such that the operational effects of the two plasma treatment chambers 114,150 within the system 110 will be substantially the same as will become more apparent hereinafter.

Figure 1:
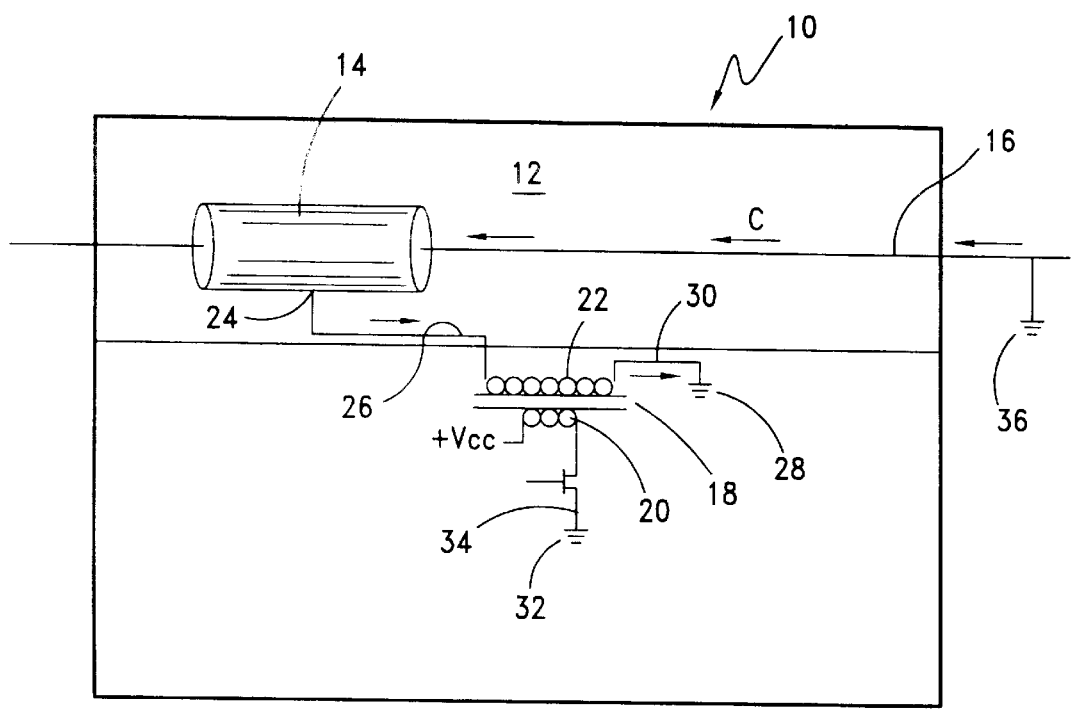
FIG. 1 is a schematic diagram of a PRIOR ART single electrode plasma treatment chamber system.

A high voltage generator transformer is disclosed at 118, and it is seen that the high voltage generator transformer 118 comprises a primary winding stage 120 and a secondary winding stage 122. A first end of the secondary winding stage 122 of the high voltage generator transformer 118 is electrically connected to a first electrode 124 of the first plasma treatment chamber 114 by means of a first electrical conductor wire 126, however, in lieu of the second end of the secondary winding stage 122 of the high voltage generator transformer 118 being electrically connected to ground as was the case in the prior art system illustrated in FIG. 1, a second electrical conductor wire 130 electrically connects the second end of the secondary winding stage 122 of the high voltage generator transformer 118 to a second electrode 152 of the second plasma treatment chamber 150. The primary winding stage 120 of the high voltage generator transformer 118 is noted as being electrically connected to ground, as at 132, by means of a third electrical conductor wire 134, and the wire to be treated 116 may or may not be grounded, the ground connection being shown at 136 if the wire to be treated 116 is in fact grounded.

As a result of the aforenoted disposition or provision of the second plasma treatment chamber 150 within the insulation enclosure 112, as well as the arrangement and electrical connection of the various components of the dual electrode plasma treatment chamber system 110 in accordance with the principles and teachings of the present invention, it is to be appreciated that the secondary winding stage 122 of the high voltage generator transformer 118 is electrically connected to both the first and second plasma treatment chambers 114,150. Accordingly, it can be further appreciated that equal and opposite voltages, that is, voltage levels which are equal in amplitude but opposite in phase, or in other words, 180° out-of-phase with respect to each other, are therefore applied to the electrode 124,152. The loading effects of the two out-of-phase electrodes 124,152 therefore effectively cancel each other whereby substantially all of the circulating electrical current, as designated by means of the arrows C', is contained within the insulated enclosure while only voltage levels, which are acceptably low from a personnel safety point of view, are effectively impressed or present upon, for example, that portion of the wire to be treated which is disposed externally of the insulated enclosure, and yet, the voltage levels are obviously nevertheless sufficient enough within each plasma treatment chamber 114,150 to permit the desired surface treatment of the wire to be treated 116 to still be achieved. It has been determined, for example, that the open circuit RMS voltage appearing or present upon the wire to be treated 116 was 12.2V, and a corresponding current value would be less than 1 mA. These values are well below any dangerous levels whereby electrical hazards to operator personnel no longer exist. In addition, in view of the fact that the system 110 of the present invention, unlike the prior art capacitive and inductive loading devices or techniques, is not dependent or interdependent upon the particular size and type of wire being treated, the dual electrode plasma treatment chamber system 110 of the present invention may be utilized with any type or size of wire to be treated and without any need for setup time comprising the connection of such capacitive or inductive loading devices, and/or the disconnection of other capacitive or inductive loading devices, and in addition, no downtime of the wire treatment system needs to be sustained.

Thus, it may be seen that in accordance with the principles and teachings of the present invention, a new and improved dual electrode plasma treatment chamber system has been developed wherein the various operational disadvantages and drawbacks characteristic of prior art systems have been resolved and effectively overcome or rectified. More particularly, as a result of the incorporation of the second plasma treatment chamber within the insulated enclosure, and the electrical connection of the secondary winding stage of the high voltage generator transformer to the electrode of the second plasma treatment chamber, in lieu of electrically connecting the secondary winding stage of the high voltage generator transformer to ground, substantially all of the circulating electrical current is contained within the insulated enclosure while only voltage levels, which are acceptably low from a personnel safety point of view, are effectively impressed or present upon, for example, that portion of the wire to be treated which is disposed externally of the insulated enclosure. In this manner, correspondingly low current values are also present within or upon that portion of the wire to be treated which is disposed externally of the insulated enclosure.

Accordingly, such an arrangement or system is rendered entirely safe for operator personnel even if the operator personnel should come into contact with or intentionally touch that portion of the wire to be treated which is disposed externally of the insulated enclosure attendant various stages of the wire treatment process. It is to be further appreciated that the system of the present invention is also quite novel and unique due to its simplicity. More particularly, there is no need for the incorporation into the system of any auxiliary capacitive or inductive loading devices, which would require setup times comprising the connection and/or the disconnection of particular capacitive or inductive loading devices attendant the treatment of particular wires, and in addition, with the system of the present invention, no operational downtime of the wire treatment system needs to be sustained. Still further, in view of the fact that the system of the present invention, unlike the prior art solutions which comprised the incorporation therein of the noted capacitive and inductive loading devices or techniques, the present invention system is not dependent or interdependent upon the particular size and type of wire being treated, and therefore, the dual electrode plasma treatment chamber system of the present invention may be utilized with any type or size of wire to be treated.

Obviously, many variations and modifications of the present invention are possible in light of the above teachings. It is therefore to be understood that within the scope of the appended claims, the present invention may be practiced otherwise than as specifically described herein.

What is claimed as new and desired to be protected by Letters Patent of the United States of America, is:

1. A dual electrode plasma treatment chamber system for the treatment of wires, comprising:

an insulated enclosure;

a first plasma treatment chamber disposed within said insulated enclosure;

a first electrode disposed upon said first plasma treatment chamber;

a second plasma treatment chamber disposed within said insulated enclosure and coaxially spaced from said first plasma treatment chamber and configured to permit a wire to be treated to be coaxially passed through said first and second plasma treatment chambers disposed within said insulated enclosure;

a second electrode disposed upon said second plasma treatment chamber;

a high-voltage generator transformer comprising a primary winding stage and a secondary winding stage;

said primary winding stage of said high-voltage generator transformer being electrically connected to ground; and means for electrically connecting said first and second plasma treatment chambers to said secondary winding stage of said high-voltage generator transformer such that relatively low voltage and current levels will be present upon a portion of the wire to be treated which is disposed externally of said insulated enclosure wherein operator personnel can safely touch the portion of the wire to be treated which is disposed externally of said insulated enclosure without experiencing life-threatening voltage and current levels.

2. The system as set forth in claim 1, wherein:

said first and second plasma treatment chambers are electrically connected to opposite ends of said secondary winding stage of said high-voltage generator transformer.

3. The system as set forth in claim 1, wherein:

said first and second plasma treatment chambers are electrically connected to opposite ends of said secondary winding stage of said high-voltage generator transformer such that equal and opposite voltage levels are applied to each one of said first and second electrodes of said first and second plasma treatment chambers.

4. The system as set forth in claim 3, wherein:

said equal and opposite voltage levels comprise voltage levels which are equal in magnitude but 180° out-of-phase with respect to each other.

5. The system as set forth in claim 1, wherein:

said primary winding stage of said high-voltage generator transformer is electrically connected to a power source; and said secondary winding stage of said high-voltage generator transformer generates approximately 30,000V.

6. The system as set forth in claim 1, wherein:

said relatively low voltage and current levels present upon the portion of the wire to be treated which is disposed externally of said insulated enclosure are approximately 12.2V and less than 1 mA, respectively.

7. A dual electrode plasma treatment chamber system for the treatment of wires, comprising:

an insulated enclosure;

a first plasma treatment chamber disposed within said insulated enclosure;

a first electrode disposed upon said first plasma treatment chamber;

a second plasma treatment chamber disposed within said insulated enclosure and coaxially spaced from said first plasma treatment chamber and configured to permit a wire to be treated to be coaxially passed through said first and second plasma treatment chambers disposed within said insulated enclosure;

a second electrode disposed upon said second plasma treatment chamber;

a high-voltage generator transformer comprising a primary winding stage and a secondary winding stage;

said primary winding stage of said high-voltage generator transformer being electrically connected to ground; and said secondary winding stage of said high-voltage generator transformer being electrically connected to said first and second plasma treatment chambers such that relatively low voltage and current levels will be present upon a portion of the wire to be treated which is disposed externally of said insulated enclosure wherein operator personnel can safely touch the portion of the wire to be treated which is disposed externally of said insulated enclosure without experiencing life-threatening voltage and current levels.

8. The system as set forth in claim 7, wherein:

said first and second plasma treatment chambers are electrically connected to opposite ends of said secondary winding stage of said high-voltage generator transformer.

9. The system as set forth in claim 7, wherein:

said first and second plasma treatment chambers are electrically connected to opposite ends of said secondary winding stage of said high-voltage generator transformer such that equal and opposite voltage levels are applied to each one of said first and second electrodes of said first and second plasma treatment chambers.

10. The system as set forth in claim 9, wherein:

said equal and opposite voltage levels comprise voltage levels which are equal in magnitude but 180° out-of-phase with respect to each other.

11. The system as set forth in claim 7, wherein:

said primary winding stage of said high-voltage generator transformer is electrically connected to a power source; and said secondary winding stage of said high-voltage generator transformer generates approximately 30,000V.

12. The system as set forth in claim 7, wherein:

said relatively low voltage and current levels present upon the portion of the wire to be treated which is disposed externally of said insulated enclosure are approximately 12.2V and less than 1 mA, respectively.

13. A dual electrode plasma treatment chamber system for the treatment of wires, comprising:

an insulated enclosure;

a first plasma treatment chamber disposed within said insulated enclosure;

a first electrode disposed upon said first plasma treatment chamber;

a second plasma treatment chamber disposed within said insulated enclosure and coaxially spaced from said first plasma treatment chamber and configured to permit a wire to be treated to be coaxially passed through said first and second plasma treatment chambers disposed within said insulated enclosure;

a second electrode disposed upon said second plasma treatment chamber;

a high-voltage generator transformer comprising a primary winding stage and a secondary winding stage;

said primary winding stage of said high-voltage generator transformer being electrically connected to ground; and said first and second plasma treatment chambers being respectively electrically connected to said secondary winding stage of said high-voltage generator transformer such that relatively low voltage and current levels will be present upon a portion of the wire to be treated which is disposed externally of said insulated enclosure wherein operator personnel can safely touch the portion of the wire to be treated which is disposed externally of said insulated enclosure without experiencing life-threatening voltage and current levels.

14. The system as set forth in claim 13, wherein:

said first and second plasma treatment chambers are electrically connected to opposite ends of said secondary winding stage of said high-voltage generator transformer.

15. The system as set forth in claim 13, wherein:

said first and second plasma treatment chambers are electrically connected to opposite ends of said secondary winding stage of said high-voltage generator transformer such that equal and opposite voltage levels are applied to each one of said first and second electrodes of said first and second plasma treatment chambers.

16. The system as set forth in claim 15, wherein:

said equal and opposite voltage levels comprise voltage levels which are equal in magnitude but 180° out-of-phase with respect to each other.

17. The system as set forth in claim 13, wherein:

said primary winding stage of said high-voltage generator transformer is electrically connected to a power source; and said secondary winding stage of said high-voltage generator transformer generates approximately 30,000V.

18. The system as set forth in claim 13, wherein:

said relatively low voltage and current levels present upon the portion of the wire to be treated which is disposed externally of said insulated enclosure are approximately 12.2V and less than 1 mA, respectively.

* * * * *